United States Patent [19]

Hayata

[11] Patent Number: 5,367,404
[45] Date of Patent: Nov. 22, 1994

[54] IMAGE PROJECTION METHOD AND SEMICONDUCTOR DEVICE MANUFACTURING METHOD USING THE SAME

[75] Inventor: Shigeru Hayata, Kodaira, Japan
[73] Assignee: Canon Kabushiki Kaisha, Tokyo, Japan
[21] Appl. No.: 177,186
[22] Filed: Jan. 3, 1994

Related U.S. Application Data

[63] Continuation of Ser. No. 918,039, Jul. 24, 1992, abandoned.

[30] Foreign Application Priority Data

Aug. 2, 1991 [JP] Japan .................. 3-194113

[51] Int. Cl.⁵ .................. G02B 27/00; G02B 27/42; G03B 27/72; C03F 7/20
[52] U.S. Cl. .................. 359/558; 359/738; 359/894; 355/53; 355/71
[58] Field of Search .............. 359/558, 564, 566, 894, 359/568, 738; 355/53, 71

[56] References Cited

U.S. PATENT DOCUMENTS

4,589,769  5/1986  Matsuki ........................ 355/71
5,059,013  10/1991 Jain ............................. 359/894

FOREIGN PATENT DOCUMENTS

0500393  8/1992  European Pat. Off. .
0526242  2/1993  European Pat. Off. .
3430752  3/1985  Germany .
59-149317 8/1984  Japan .

OTHER PUBLICATIONS

Patent Abstracts of Japan, Kokai No. 56-045023, vol. 5, No. 103, Jul. 1981.
Kamon, et al., "Photolithography System Using Annular Illumination," Japanese Journal of Applied Physics, vol. 30, No. 11B, Nov. 1991, pp. 3021 through 3029.

*Primary Examiner*—William L. Sikes
*Assistant Examiner*—David R. Parsons
*Attorney, Agent, or Firm*—Fitzpatrick, Cella, Harper & Scinto

[57] ABSTRACT

An image projection apparatus and method is disclosed wherein a stop having a rectangular opening is disposed in an illumination optical system and, through the function of this stop, a rectangular effective light source is defined on a pupil of a projection optical system. With light from this effective light source, longitudinal and transverse patterns of a reticle extending substantially along the configuration of the effective light source are illuminated. Zeroth order and first order diffraction light caused by these patterns is incident and distributed on the pupil so as to define thereon a rectangular configuration about the center of the pupil, and the longitudinal and transverse patterns are imaged with the diffraction light.

10 Claims, 5 Drawing Sheets

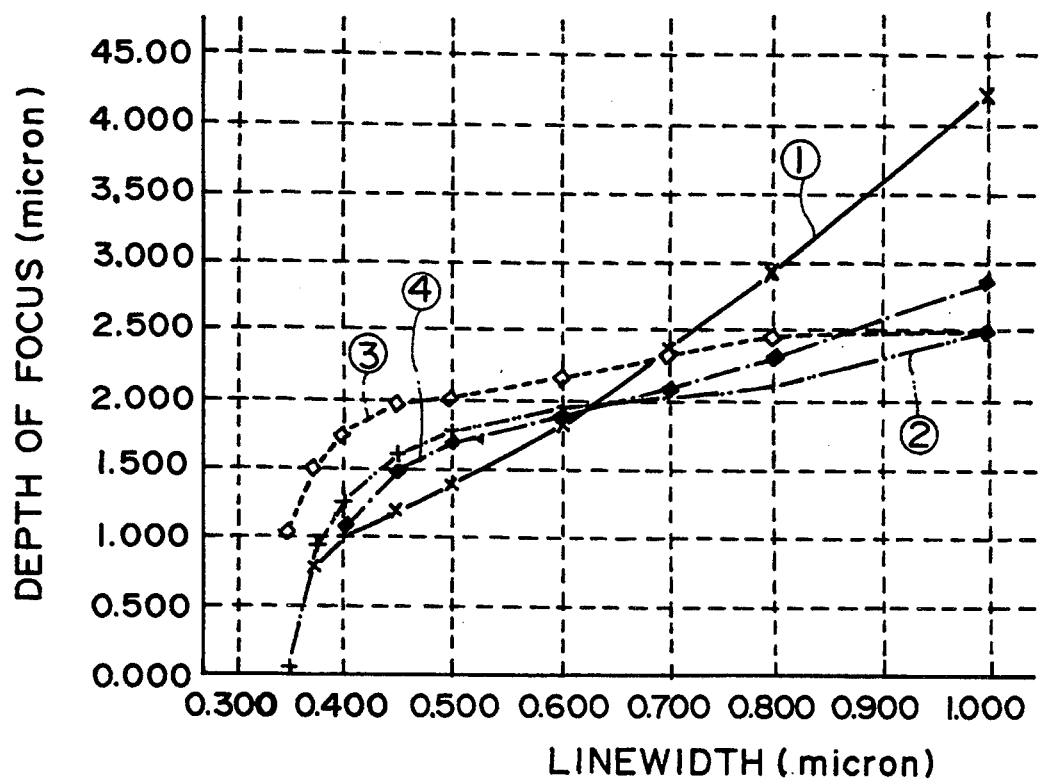
F I G. 5
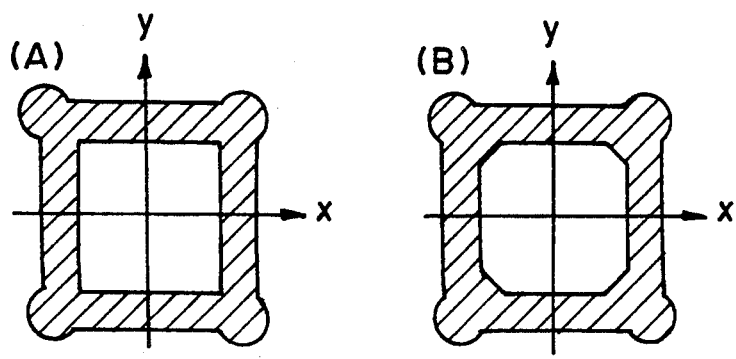
F I G. 6

IMAGE PROJECTION METHOD AND SEMICONDUCTOR DEVICE MANUFACTURING METHOD USING THE SAME

This application is a continuation of prior application Ser. No. 07/918,039 filed Jul. 24, 1992, now abandoned.

FIELD OF THE INVENTION AND RELATED ART

This invention relates to an image projection method and a semiconductor device manufacturing method using the same. More particularly, the invention is concerned with an improved image projection method suitable for forming on a wafer a circuit pattern of a linewidth not greater than 0.5 micron and with an improved semiconductor device manufacturing method based on such an image projection method.

The degree of integration of each semiconductor device such as IC, LSI or the like has been increased more and more and, along this, the fine processing technique has been improved considerably. Particularly, the exposure technique which is the major processing technique in semiconductor device manufacturing processes has been advanced into a submicron region, with manufacture of a 1 mega-DRAM. A representative exposure apparatus therefor is a reduction projection exposure apparatus, called a stepper. It is not an overestimation to say that the resolution of such a stepper determines the future of semiconductor devices.

A conventionally adopted method for improving the resolution of the stepper is mainly to enlarge the numerical aperture (NA) of a projection optical system (reduction lens system). Since however the depth of focus of a projection optical system is in inverse proportion to the square of the NA, enlarging the NA results in a decrease of the depth of focus, causing a difficulty of forming on a wafer an image of good contrast. In consideration of this problem, a recently adopted method for enhancing the resolution is to use shorter wavelengths for the exposure light, such as by using i-line light (365 nm) or KrF excimer laser light (248 nm) in place of g-line light (436 nm). This relies upon an effect that, if the depth of focus allowable in the optical system is considered as constant, the resolution increase is in inverse proportion to the square root of the wavelength.

On the other hand, independently of enlarging the NA of a projection optical system or using shorter wavelengths of exposure light, there is a method of improving the resolution of a stepper by illuminating a reticle in a specific manner. An example according to this method is that a reticle is illuminated with light which forms a ring-like effective light source (a virtual light source formed by zeroth order light) at a pupil of a projection optical system. With this method, diffraction light (zeroth and first orders) produced by a circuit pattern of a reticle can be projected onto the pupil of the projection optical system. The light that forms a ring-like effective light source can be supplied by forming a ring-like secondary light source at a position within the illumination system which is optically conjugate with the pupil of the projection optical system.

With this illumination method, however, the depth of focus of the projection optical system is not so improved and, therefore, if this illumination method is applied to a projection exposure apparatus, it is not easy to obtain an image of good contrast.

SUMMARY OF THE INVENTION

It is accordingly an object of the present invention to provide an image projection method wherein a fine pattern including longitudinal and transverse patterns is illuminated, wherein diffraction light caused by the fine pattern is projected on a pupil of a projection optical system, and specifically wherein the fine pattern is illuminated with such light that defines on the pupil an effective light source of substantially rectangular shape having sides extending in the directions of the longitudinal and transverse patterns, by which the depth of focus of the projection optical system can be improved.

It is another object of the present invention to provide a semiconductor device manufacturing method wherein a circuit pattern is illuminated, wherein diffraction light caused by the circuit pattern is projected on a pupil of a projection optical system and an image of the circuit pattern is projected on a wafer so as to transfer the image of the circuit pattern onto the wafer, and specifically wherein the fine pattern is illuminated with such light that defines on the pupil an effective light source of substantially rectangular shape having sides extending in the directions of the longitudinal and transverse patterns, constituting the circuit pattern, by which the depth of focus of the projection optical system can be improved.

The "side" of the effective light source means the side that defines the basic configuration of the effective light source. It comprehends not only the one provided by connected straight lines as viewed microscopically but also the one which is provided by connected curved lines as viewed microscopically but the connections of which are along a predetermined straight line when viewed macroscopically.

In a preferred form of the present invention, the inside peripheral configuration of the ring-like effective light source is mainly defined by those sides extending in the aforementioned directions, and the sides of the inside peripheral configuration include a first pair of sides which are symmetrical with respect to an axis parallel to the direction of elongation of a transverse pattern, extending through the center of the pupil, and a second pair of sides which are symmetrical with respect to an axis parallel to the direction of elongation of a longitudinal pattern, extending through the center of the pupil. Also, the peripheral configuration of the ring-like effective light source is mainly defined by those sides extending in the aforementioned directions, and the sides of the peripheral configuration include a third pair of sides which are symmetrical with respect to an axis parallel to a transverse pattern, extending through the center of the pupil, and a fourth pair of sides which are symmetrical with respect to an axis parallel to a longitudinal pattern, extending through the center of the pupil.

Thus, in the present invention, it is possible to select illumination with the light which defines an effective light source having inside and peripheral configurations providing a substantially rectangular shape.

Since in the present invention the illumination uses the light which defines an effective light source such as described, it is possible to improve the depth of focus of a projection optical system, with respect to longitudinal and transverse patterns, as compared with the illumination using the light which defines a circular effective light source of conventional type.

In the present invention, the light that defines an effective light source as described can be supplied by providing a primary or secondary light source of a shape analogous to that of the effective light source, at a position optically conjugate with the pupil of the projection optical system.

In another aspect of the present invention, there is provided a semiconductor device manufacturing method wherein a circuit pattern is illuminated and wherein diffraction light caused by the circuit pattern is projected on a pupil of a projection optical system and an image of the circuit pattern is projected on a wafer, whereby the image of the circuit pattern is transferred onto the wafer, and specifically wherein the circuit pattern is illuminated with light from a secondary light source of a predetermined shape so as to assure that zeroth order diffraction light and first order diffraction light caused by longitudinal and transverse patterns, constituting the circuit pattern, is distributed along a substantially rectangular configuration about the center of the pupil.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 4A–4C are schematic views for explaining the advantages of the effective light source applied to the FIG. 1 apparatus, wherein FIG. 4A illustrates longitudinal and transverse patterns, FIG. 4B illustrates preferable distribution of diffraction light upon the pupil, and FIG. 4C illustrates the basic form of the effective light source that produces the diffraction light distribution of FIG. 4B.

FIG. 5 is a graph showing the relationship between the linewidth of a bar chart image and the depth of focus of a projection lens system, based on the results of computer simulation made on the imaging characteristic in accordance with an image projection method, for forming a rectangular ring-like effective light source of FIG. 4C, and an image projection method for forming a circular effective light source.

FIG. 6 is a schematic view of variations of the effective light source of the present invention.

DESCRIPTION OF THE PREFERRED EMBODIMENTS

Figure 1:
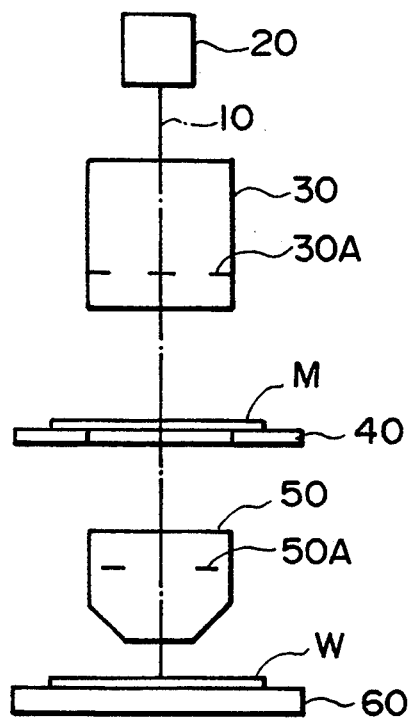
FIG. 1 is a schematic view of a projection exposure apparatus to which a method of the present invention is applied.

FIG. 1 shows a projection exposure apparatus for manufacturing semiconductor devices in accordance with a method of the present invention.

Denoted in FIG. 1 at M is a reticle having a circuit pattern formed thereon. Denoted at W is a wafer which is coated with a resist. Denoted at 10 is an optical axis of the apparatus; at 20 is a light source (primary light source); at 30 is an illumination optical system for directing light from the light source 20 to the reticle M; and at 30A is an aperture stop of the illumination optical system 30. The aperture stop 30A is placed in the neighborhood of the light exit surface of an optical integrator (fly's eye lens), not shown, of the illumination optical system 30, and it cooperates with the optical integrator to form a ring-like secondary light source at its opening. Denoted at 40 is a reticle stage for supporting the reticle M; at 50 is a projection lens system for projecting a reduced image of the circuit pattern of the reticle M uniformly illuminated with the light from the ring-like secondary light source of the illumination optical system 30; and denoted at 50A is an aperture stop of the projection lens system 50. The aperture stop 50A defines the pupil of the projection lens system 50. Here, the position of the stop 50 is taken as the position of the pupil. Denoted at 60 is a wafer stage for supporting the wafer W, and this stage 60 supports the wafer W so as to bring the wafer W surface into alignment with the imaging plane of the circuit pattern of the reticle M by the projection lens system 50.

When in the above-described structure the reticle M is illuminated by using the light source 20 and the illumination optical system 30, diffraction light caused by the circuit pattern of the reticle M, mainly consisting of a combination of longitudinal and transverse patterns), is received by opening the stop 50A of the projection lens system 50. Thus, with the diffraction light, the projection lens system 50 projects an image of the circuit pattern of the reticle M onto the wafer W, whereby the image of the circuit pattern is transferred to the resist of the wafer W. Through such an exposure-transfer process, semiconductor chips can be manufactured from the wafer W.

In the apparatus of FIG. 1, the position of the stop 30A of the illumination optical system 30 and the position of the stop 50A of the projection lens system 50 are placed in an optically conjugate relationship with each other, and an image of the opening of the stop 30A (i.e. secondary light source) is projected upon the opening of the stop 50A of the projection lens system 50. Thus, by appropriately setting the shape and/or the size of the opening of the stop 30A (i.e. the shape or size of the secondary light source), the shape or size of the image of the opening of the stop 30A to be formed on the opening of the stop 50A (namely, the shape or size of the effective light source) is determined appropriately. It is to be noted that the opening of the stop 50A has a circular shape.

Figure 2:
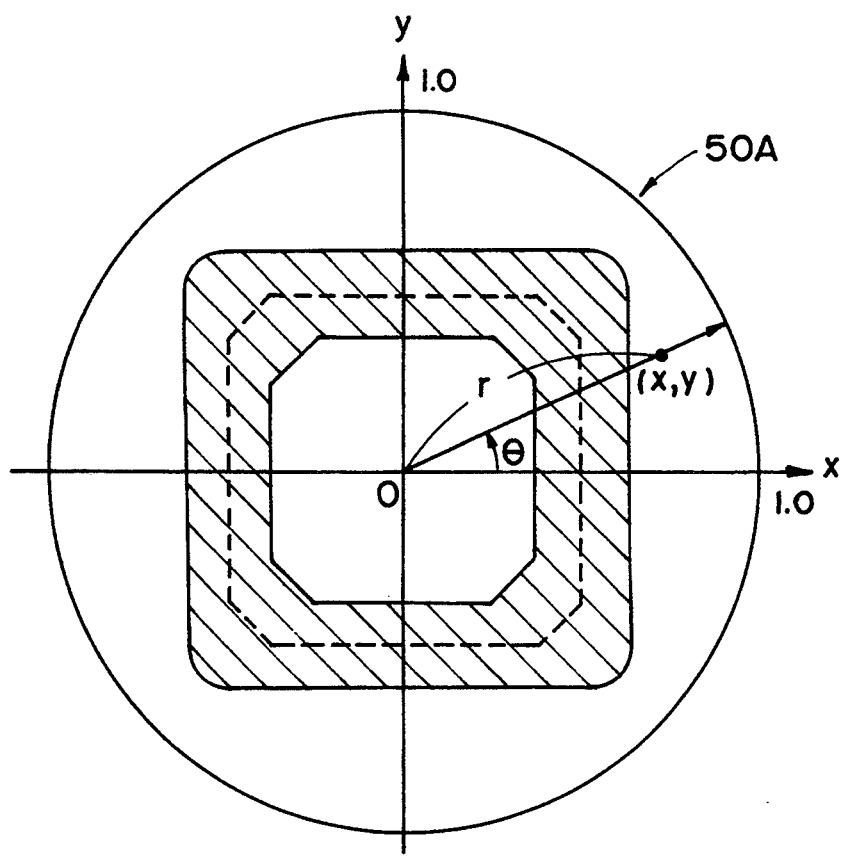
FIG. 2 is a schematic view of an effective light source on a pupil in the apparatus of FIG. 1.
Figure 3:
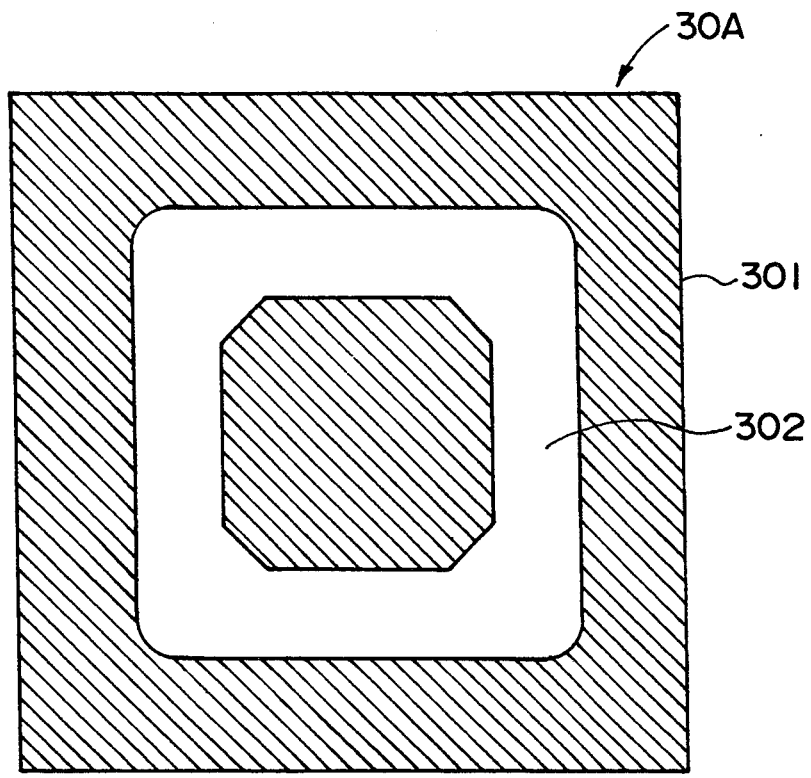
FIG. 3 is a schematic view of an aperture stop in an illumination optical system of the FIG. 1 apparatus.

FIG. 2 is a schematic view of the effective light source defined on the pupil (hereinafter "pupil 50A") of the projection lens system 50 of FIG. 1, and FIG. 3 is a front view of the stop 30A of the illumination optical system 30 of the FIG. 1 apparatus. In FIG. 2, the pupil 50A of the projection lens system 50 as well as the effective light source are illustrated with reference to an x-y coordinate system with its origin coinciding with the center of the pupil 50A. The x axis of this x-y coordinate system corresponds to the direction of elongation of a transverse pattern (linear pattern extending transversely or laterally) of the reticle M, while the y axis of the x-y coordinate system corresponds to the direction of elongation of a longitudinal pattern (linear pattern extending longitudinally) of the reticle M. Since the optical integrator of the FIG. 1 apparatus comprises a fly's eye lens consisting of a combination of lens elements as illustrated in the sectional view of FIG. 7, the effective light source as can be practically observed upon the pupil 50A is such as shown in FIG. 8. This effective light source is configured by curved lines defined by connected peripheral configurations of images of the inside and outside lens elements, but here the peripheral configuration of the effective light source is taken as one configured by lines extending along the array of the images of the inside and outside lens elements.

As depicted by a hatched zone in FIG. 2, in the FIG. 1 apparatus a ring-like effective light source having sides extending along the directions of elongation of the longitudinal and transverse patterns of the reticle M, is formed on the pupil 50A. This effective light source comprises a ring-like effective light source whose inside and outside peripheral configurations are approximately rectangular.

When polar coordinates (r, θ) are defined in FIG. 2 (x=rcosθ, y=rsinθ) and if the center of the pupil 50A is denoted by r=0 and the radius of the pupil 50A is denoted by r=1, then Rm(θ) of the gravity center position (R m(θ), (θ)) of the intensity I(r, θ) of each of the portions of the effective light source extending radially with an angle θ from the x axis of the pupil 50A, can be expressed as follow:

$$Rm(\theta) = \left\{ \int_0^1 r(r, \theta) dr \right\} / \left\{ \int_0^1 I(r, \theta) dr \right\}$$

The broken line shown in FIG. 2 depicts a line connecting the gravity center positions (R m(θ), θ) with respect to 0=0 to 360 (deg). And, the feature of this effective light source is that: the effective light source of this embodiment takes an approximately rectangular shape wherein most of the lines connecting the gravity center positions with respect to the radial direction (r direction) in the range of θ=0 to 360 (deg), are parallel to the x or y axis; and that the effective light source is symmetrical with respect to the x and y axes. Also, this effective light source is so set that zeroth order diffraction light and first order diffraction light caused by longitudinal and/or transverse patterns (of the circuit pattern of the reticle M and having a minimum linewidth) are incident and distributed on the pupil 50A at those positions which are symmetrical with respect to the x or y axis. The intensities of the portions of the effective light source are substantially at the same level, and the effective light source as a whole has a substantially flat light intensity.

As shown in FIG. 3, the stop 30A of the FIG. 1 apparatus comprises a stop member having a ring-like opening 302 defined by a light blocking portion 301, the opening 302 having inside and outside peripheral configurations of approximately rectangular shape, for defining the effective light source of FIG. 2 upon the pupil 50A. Thus, in the illumination optical system 30, a ring-like effective light source having inside and outside peripheral configurations of approximately rectangular shape, is defined. While no x-y coordinate system is illustrated in FIG. 3, from the comparison with FIG. 2 it will be clear that the origin coincides with the center (optical axis) of the opening 30, that the transverse direction in the drawing corresponds to the x axis extending through the origin and that the longitudinal direction in the drawing corresponds to the y axis extending through the origin.

In the apparatus of FIG. 1, the reticle M is so illuminated that an image of the opening of the stop 30A shown in FIG. 3 is projected on the pupil 50A of the projection lens system 50, by which an approximately rectangular ring-like effective light source is formed on the pupil, while on the other hand an image of the circuit pattern of the reticle M is projected on the wafer W. Thus, as compared with the projection method wherein a circular effective light source is projected on a pupil of a projection lens system, it is possible to enlarge the depth of focus of the projection lens system with respect to the imaging of longitudinal and transverse patterns of the circuit pattern of the reticle M. Consequently, the image of the fine longitudinal and transverse patterns of the circuit pattern of the reticle M can be projected on the wafer W, stably and at high contrast. The reason for this will be explained in more detail, below.

Through investigations made by the applicants, it has been found that, in a case where fine longitudinal and transverse patterns are illuminated obliquely with light from a position off the axis, such as the light from a ring-like secondary light source, for imaging the patterns with diffraction light caused by the patterns, degradation of image quality (e.g. distortion of image) due to the defocusing is minimized when, on the pupil of a projection optical system, zeroth order diffraction light and first order diffraction light are distributed at those positions symmetrical with respect to the x or y axis of an x-y coordinate system (see FIG. 2) of the pupil. This is because, on this occasion, the difference in wavefront aberration between the zeroth order diffraction light and the first order diffraction light becomes smallest. This means that, if the zeroth order light and the first order light are distributed symmetrically with respect to the x or y axis, to a pattern of small linewidth causing a problem of the depth of focus, then the depth of focus with respect to the imaging of a pattern of fine linewidth can be improved.

Figure 4A:
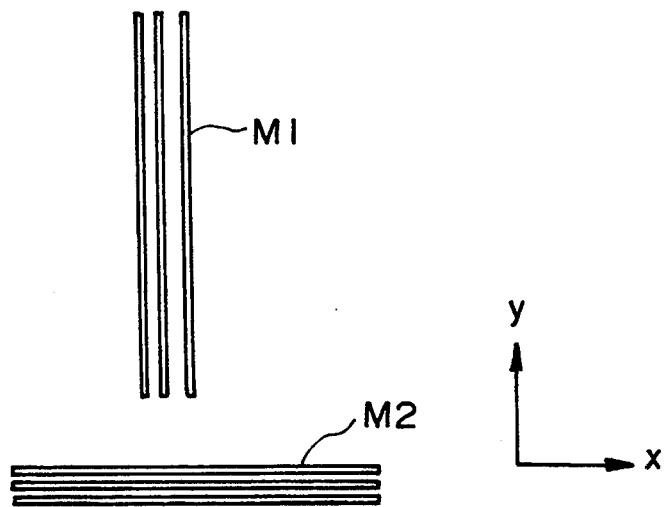
Figure 4B:
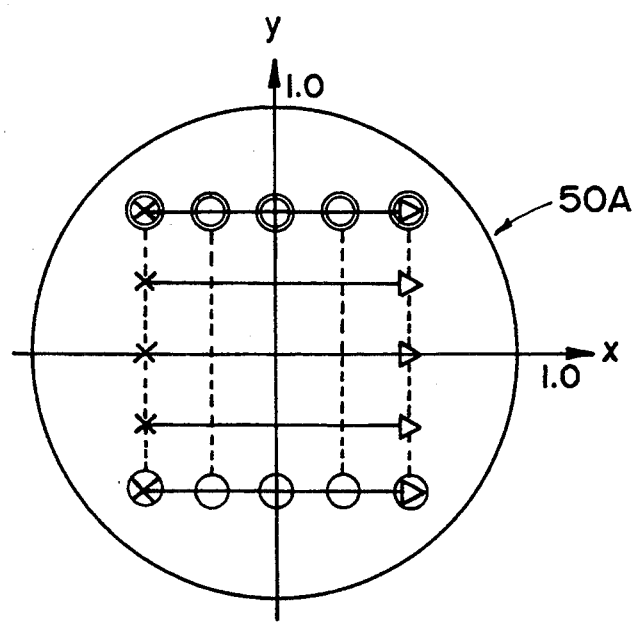
Figure 4C:
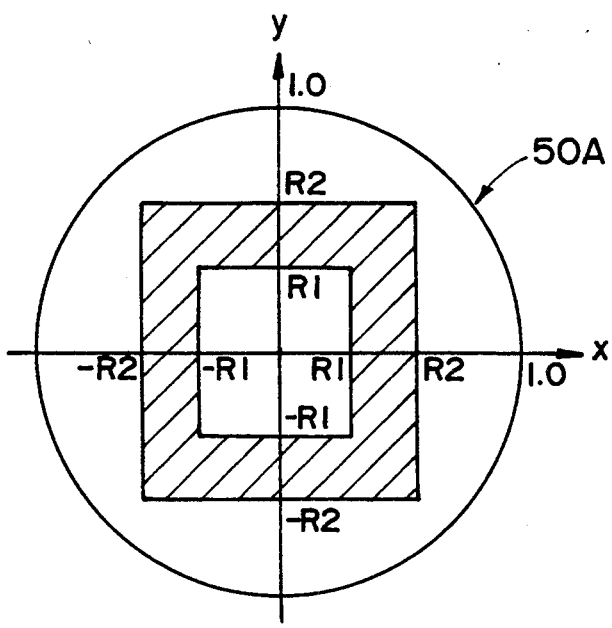

In summary, when longitudinal patterns M1 and transverse patterns M2 such as shown in FIG. 4A are to be imaged, as an example, distribution of diffraction light such as shown in FIG. 4B is preferable. In FIG. 4B, the symbols ⊙, Δ, and X denote zeroth order diffraction light and first order diffraction light. More specifically, the symbols ⊙ and  denote the pair of diffraction lights produced by the pattern M1, wherein, if the symbol ⊙ depicts the zeroth order light, the symbol  depicts the first order light, whereas if the symbol  depicts the zeroth order light, the symbol ⊙ depicts the first order light. On the other hand, the symbols Δ and X denote the pair of diffraction lights produced by the pattern M2, wherein, if the symbol Δ depicts the zeroth order light, the symbol X depicts the first order light, whereas if the symbol X depicts the zeroth order light, the symbol Δ depicts the first order light. These diffraction lights are distributed on the pupil 50A so as to define rectangular peripheral configurations. Such a distribution of diffraction light may be accomplished by forming on the pupil 50A a ring-like effective light source such as shown in FIG. 4C, having inside and outside peripheral configurations of square shape and having its center coinciding with the center (optical axis) of the pupil. If to the contrary a circular ring-like effective light source is formed on the pupil, there are produced pairs of diffraction lights which are not symmetrical with respect to the x or y axis of the x-y coordinate system of the pupil. These diffraction lights result in degradation of image quality due to defocusing, in the imaging of fine longitudinal and transverse patterns.

In consideration of the inconveniences such as above, in the present invention in order that the diffraction lights are so distributed as to form a rectangular peripheral configuration about the center of the pupil or a configuration like it, an effective light source having inside and outside peripheral configurations of square shape or rectangular shape or, alternatively, of a deformed shape of it, is provided.

FIG. 5 shows the comparison results of computer simulation made on the imaging characteristic, according to the image projection method wherein a rectangular ring-like effective light source of FIG. 4C is formed and according to the image projection method wherein a circular ring-like effective light source is formed. During the simulation, a projection lens of a numerical aperture (NA) of 0.52 and a bar chart of one dimensional line-and-space, having five lines, were selected, and the relationship between the linewidth of the bar chart image and the depth of focus at a contrast of 7% was examined under the condition that the bar chart image was imaged by using i-line (wavelength 365 nm). In FIG. 5, curve (1) depicts the characteristic of longitudinal and transverse patterns when an effective light source of Gaussian intensity distribution, having a highest intensity at the pupil center, is formed. Curve (2) depicts the characteristic of longitudinal and transverse patterns when a circular ring-like effective light source is formed. Curve (3) depicts the characteristic of longitudinal and transverse patterns when a rectangular ring-like effective light source is formed. Curve (4) depicts the characteristic of inclined (45 deg.) patterns when a rectangular ring-like effective light source is formed. In the case of curve (2), the size of the circular ring-like effective light source is such that, if the radius of the pupil is taken as 1, the radius of the inside circular peripheral configuration is 0.4 while the radius of the outside peripheral configuration is 0.8. In the cases of curves (3) and (4), the size of the rectangular ring-like effective light source is such that, in FIG. 4C (the radius of the pupil is 1), $R1=0.4$ and $R2=0.64$.

As seen from FIG. 5, the imaging characteristic of the inclined 45 deg. patterns when a rectangular ring-like effective light source is formed and the imaging characteristic of the longitudinal and transverse patterns when a circular ring-like effective light source is formed, are substantially the same. The imaging characteristic of the longitudinal and transverse patterns when a rectangular ring-like effective light source is formed is superior to that of the longitudinal and transverse patterns where an effective light source of Gaussian intensity distribution is formed or to that of the longitudinal and transverse patterns where a circular effective light source is formed; and the depth of focus to the longitudinal and transverse patterns is improved considerably. If the allowable depth of focus in a semiconductor device manufacturing exposure apparatus (stepper) such as shown in FIG. 1 is 1.5 micron, the limit resolution to longitudinal and transverse patterns in a case where a circular effective light source is formed is 0.44 micron, whereas the limit resolution to longitudinal and transverse patterns in a case where a rectangular ring-like effective light source is formed is 0.37 micron. Thus, use of the image projection method in which a rectangular ring-like effective light source is formed, assures enhancement of limit resolution to longitudinal and transverse patterns. Since a circuit pattern is mainly composed of longitudinal and transverse patterns, the enhancement of limit resolution or depth of focus in relation to such longitudinal and transverse patterns provides a large advantageous effect.

According to the investigations made by the applicants, preferable forms of such a rectangular ring-like effective light source are those such as shown in FIG. 4C, or those having a similar shape wherein, when standardization is made while taking the radius of the pupil as 1, the inside and outside peripheral configurations of the effective light source are in the ranges of $0.1 \leq R1 \leq 0.65$ and $0.25 \leq R2 \leq 0.71$.

In the apparatus of FIG. 1, the stop 30A shown in FIG. 3 is used to provide a secondary light source having inside and outside peripheral configurations of square-like shape, and an effective light source a of a shape analogous to such secondary light source is defined on the pupil 50A. However, it is within the scope of the present invention to provide a secondary light source or an effective light source of a shape other than this, for projection of an image. Examples are illustrated in FIG. 6A and 6B wherein the hatching depicts an effective light source. In the effective light sources shown in FIGS. 6A and 6B, at least one of the inside and outside peripheral configurations includes a side which extends in the direction of elongation of a longitudinal or transverse pattern. Also, in these effective light sources, the lines connecting the gravity centers with respect to the radial direction (such as shown by a broken line in FIG. 2) take an approximately rectangular shape and, with respect to the imaging of longitudinal and transverse patterns, it is possible to obtain a depth of focus greater than that attainable with a circular effective light source. In order to obtain effective light sources such as shown in FIGS. 6A and 6B, the stop 30A of the illumination optical system of the FIG. 1 apparatus may be replaced by a stop member having an opening of a shape like the hatched portion in FIG. 6A or 6B.

While in the stop 30A of FIG. 3 the portion other than the opening 302, namely, the light blocking portion 301 is arranged to fully block light, the stop may be modified so that light is partially transmitted through this portion. What is important is that the intensity of light passing through the opening 302 is sufficiently higher than that passing through the remaining portion, and that, when an image of the opening 302 is formed on the pupil 50A, an effective light source with inside and outside peripheral configurations at least one of which includes a side extending in the direction of elongation of a longitudinal or transverse pattern, is defined on the pupil 50A.

Also, it is preferable that the secondary light source or the effective light source has a uniform intensity distribution.

Figure 7:
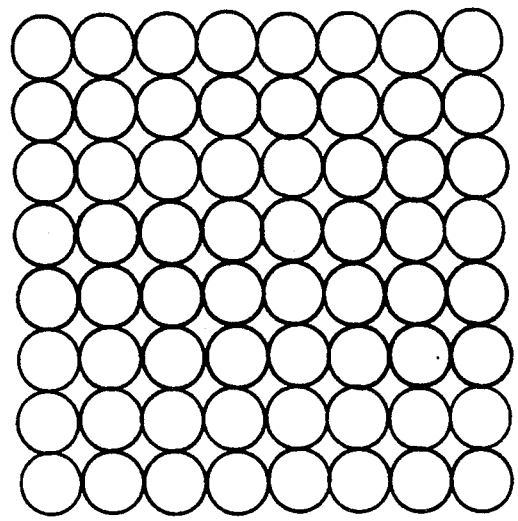
FIG. 7 is a sectional view of an optical integrator of the FIG. 1 apparatus.
Figure 8:
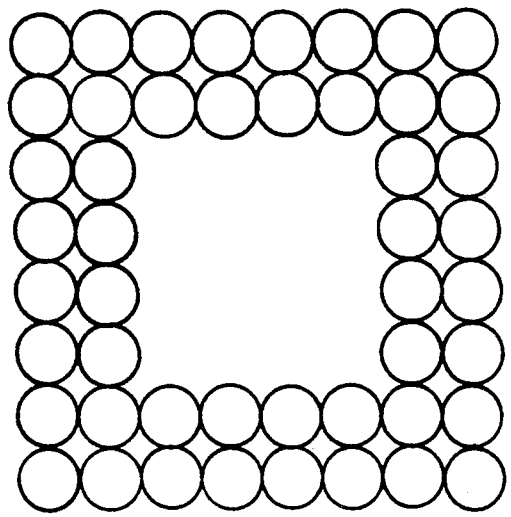
FIG. 8 is a schematic view of an effective light source on the pupil of the FIG. 1 apparatus, as can be seen practically.

In the apparatus of FIG. 1, a fly's eye lens having lens elements of circular cross-section such as shown in FIG. 7 is used. However, a fly's eye lens comprising a combination of lens elements having a square cross-section or a hexagonal cross-section, may be used.

Also, in the apparatus of FIG. 1, the stop 30A is disposed adjacent to the light exit surface of the optical integrator, it may be placed in the neighborhood of the light entrance surface of the optical integrator. On that occasion, a rectangular ring-like secondary light source is defined on the light entrance surface of the optical integrator, and an image of such a secondary light source is projected on the pupil 50A of the projection lens system 50. Further, in the apparatus of FIG. 1, a lens element or elements which are at the central portion of the optical integrator do not contribute to the definition of the ring-like secondary light source and, therefore, such an optical integrator not having such a lens element or elements is possible to use. Alternatively, the light receiving surface of such a central lens element or elements of the optical integrator may be covered by a light blocking film or the like. Moreover, the structure of the illumination optical system may be modified in various ways, known in the art. Further, as the light source 20, an ultra-high pressure Hg lamp or an excimer laser may be used, for example.

In the apparatus of FIG. 1, a projection lens system is used to project an image of the pattern of the reticle M. However, the invention is applicable also to an apparatus using a projection mirror system for the projection of an image of a pattern. Further, the invention is not limited to the projection of an image of a circuit pattern. It is applicable also to a different lithography technique, for example, for producing a device by using projection of an image of a fine grating pattern.

In the present invention as described hereinbefore, for projection of an image of a fine pattern having longitudinal and transverse patterns, an effective light source of an approximately rectangular shape having sides extending along the directions of elongation of the longitudinal and transverse patterns is formed on a pupil of a projection optical system. This assures enlargement of the depth of focus of the projection optical system. Thus, when the method of the present invention is applied to an exposure apparatus, it is possible to improve the limit resolution significantly.

While the invention has been described with reference to the structures disclosed herein, it is not confined to the details set forth and this application is intended to cover such modifications or changes as may come within the purposes of the improvements or the scope of the following claims.

What is claimed is:

1. In an image projection method wherein a fine pattern having longitudinal and transverse patterns is illuminated and wherein diffraction light caused by the fine pattern is projected on a pupil of a projection optical system, for projection of an image of the fine pattern, the improvements residing in:

that the fine pattern is illuminated with light which defines on the pupil an effective light source of ring-like shape having sides extending in directions of elongation of the longitudinal and transverse patterns, respectively, and having a substantially uniform intensity therewithin;

that an inside peripheral configuration of the effective light source is mainly composed of sides extending in said directions, respectively;

that the sides of the inside peripheral configuration of the effective light source comprise a first pair of sides which are symmetrical with each other with respect to an axis extending through the center of the pupil and in parallel to the transverse pattern, and a second pair of sides which are symmetrical with each other with respect to an axis extending through the center of the pupil and in parallel to the longitudinal pattern:

that an outside peripheral configuration of the effective light source is mainly composed of sides extending in said directions, respectively; and that the sides of the outside peripheral configuration comprise a third pair of sides which are symmetrical with each other with respect to an axis extending through the center of the pupil and in parallel to the transverse pattern, and a fourth pair of sides which are symmetrical with each other with respect to an axis extending through the center of the pupil and in parallel to the longitudinal pattern.

2. A method according to claim 1, wherein the inside and outside peripheral configurations of the effective light source form an approximately rectangular shape.

3. A method according to claim 1, wherein the following relations are satisfied:

$$0.1 \leq R1 \leq 0.65$$

$$0.25 \leq R2 \leq 0.71$$

where the radius of the pupil is 1, R1 denotes the distance from the optical axis to the first and second pairs of sides and R2 denotes the distance from the optical axis to the third and fourth pairs of sides.

4. In a semiconductor device manufacturing method wherein a circuit pattern having longitudinal and transverse patterns is illuminated and wherein diffraction light caused by the circuit pattern is projected on a pupil of a projection optical system, for projection of an image of the circuit pattern on a wafer for transfer of the circuit pattern image to the wafer, the improvements residing in:

that the circuit pattern is illuminated with light which defines on the pupil an effective light source of ring-like shape having sides extending in directions of elongation of the longitudinal and transverse patterns, respectively, and having a substantially uniform intensity therewithin;

that an inside peripheral configuration of the effective light source is mainly composed of sides extending in said directions, respectively;

that the sides of the inside peripheral configuration of the effective light source comprise a first pair of sides which are symmetrical with each other with respect to an axis extending through the center of the pupil and in parallel to the transverse pattern, and a second pair of sides which are symmetrical with each other with respect to an axis extending through the center of the pupil and in parallel to the longitudinal pattern;

that an outside peripheral configuration of the effective light source is mainly composed of sides extending in said directions, respectively; and that the sides of the outside peripheral configuration comprise a third pair of sides which are symmetrical with each other with respect to an axis extending through the center of the pupil and in parallel to the transverse pattern, and a fourth pair of sides which are symmetrical with each other with respect to an axis extending through the center of the pupil and in parallel to the longitudinal pattern.

5. A method according to claim 4, wherein the inside and outside peripheral configurations of the effective light source form an approximately rectangular shape.

6. A method according to claim 4, wherein the following relations are satisfied:

$$0.1 \leq R1 \leq 0.65$$

$$0.25 \leq R2 \leq 0.71$$

where the radius of the pupil is 1, R1 denotes the distance from the optical axis to the first and second pairs of sides and R2 denotes the distance from the optical axis to the third and fourth pairs of sides.

7. In a semiconductor device manufacturing method wherein a circuit pattern having longitudinal and transverse pattern is illuminated and wherein diffraction light caused by the circuit pattern is projected on a pupil of a projection optical system for projection of an image of the circuit pattern on a wafer for transfer of the circuit pattern image to the wafer, the improvements residing in:

that the circuit pattern is illuminated with light from a secondary light source of a predetermined shape so that zeroth order diffraction light and first order diffraction light caused by the longitudinal and transverse patterns of the circuit pattern are distributed along an approximately rectangular configuration defined about the center of the pupil.

8. A projection exposure apparatus comprising:

means for illuminating a fine pattern having longitudinal and transverse patterns; and a projection optical system for projecting the illuminated fine pattern onto a substrate to be exposed, wherein the fine pattern is illuminated with light which defines on a pupil an effective light source of ring-like shape having sides extending in directions of elongation of the longitudinal and transverse patterns, respectively, and having a substantially uniform intensity therewithin, the inside peripheral configuration of the effective light source is mainly comprised of sides extending in said directions, respectively, the sides of the inside peripheral configuration of the effective light source comprise a first pair of sides which are symmetrical with each other with respect to an axis extending through the center of the pupil and parallel to the transverse pattern, and a second pair of sides which are symmetrical with each other with respect to an axis extending through the center of the pupil and parallel to the longitudinal pattern, the outside peripheral configuration of the effective light source is mainly comprised of sides extending in said directions, respectively, and the sides of the outside peripheral configuration comprise a third pair of sides which are symmetrical with each other with respect to an axis extending through the center of the pupil and parallel to the transverse pattern, and a fourth pair of sides which are symmetrical with each other with respect to an axis extending through the center of the pupil and parallel to the longitudinal pattern.

9. An apparatus according to claim 8, wherein the inside and outside peripheral configurations of the effective light source form an approximately rectangular shape.

10. An apparatus according to claim 8, wherein the following relations are satisfied:

$$0.1 \leq R1 \leq 0.65$$

$$0.25 \leq R2 \leq 0.71$$

where the radius of the pupil is 1, R1 denotes the distance from the optical axis to the first and second pairs of sides and R2 denotes the distance from the optical axis to the third and fourth pairs of sides.

* * * * *

UNITED STATES PATENT AND TRADEMARK OFFICE
CERTIFICATE OF CORRECTION

PATENT NO. : 5,367,404
DATED : November 22, 1994
INVENTOR(S) : Shigeru HAYATA

It is certified that error appears in the above-indentified patent and that said Letters Patent is hereby corrected as shown below:

COLUMN 1:

Line 21, "along this," should read --along with this,--.

COLUMN 5:

Line 25, "follow:" should read --follows:--.

COLUMN 8:

Line 17, "a of a" should read --of a--.
Line 18, "such" should read --such a--.
Line 62, "the stop" should read --while the stop--.

Signed and Sealed this

Eleventh Day of April, 1995

Attest:

BRUCE LEHMAN

Attesting Officer     Commissioner of Patents and Trademarks